(12) United States Patent
Liu et al.

(10) Patent No.: US 10,854,472 B2
(45) Date of Patent: Dec. 1, 2020

(54) METHOD FOR FORMING A METAL GATE INCLUDING DE-OXIDATION OF AN OXIDIZED SURFACE OF THE METAL GATE UTILIZING A REDUCING AGENT

(71) Applicant: GLOBALFOUNDRIES Inc., Grand Cayman (KY)

(72) Inventors: Huang Liu, Mechanicville, NY (US); Wen-Pin Peng, Clifton Park, NY (US); Jean-Baptiste Laloe, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 986 days.

(21) Appl. No.: 14/219,039

(22) Filed: Mar. 19, 2014

(65) Prior Publication Data

US 2015/0270142 A1     Sep. 24, 2015

(51) Int. Cl.
| | |
|---|---|
| H01L 21/312 | (2006.01) |
| H01L 21/321 | (2006.01) |
| H01L 29/66 | (2006.01) |
| H01L 27/092 | (2006.01) |
| H01L 29/417 | (2006.01) |
| H01L 21/8238 | (2006.01) |
| H01L 21/02 | (2006.01) |
| H01L 29/78 | (2006.01) |
| H01L 29/49 | (2006.01) |
| H01L 21/768 | (2006.01) |

(52) U.S. Cl.
CPC ...... *H01L 21/321* (2013.01); *H01L 21/02063* (2013.01); *H01L 21/02074* (2013.01); *H01L 21/76814* (2013.01); *H01L 21/76823* (2013.01); *H01L 21/823828* (2013.01); *H01L 21/823878* (2013.01); *H01L 27/092* (2013.01); *H01L 29/41783* (2013.01); *H01L 29/4966* (2013.01); *H01L 29/66545* (2013.01); *H01L 29/78* (2013.01)

(58) Field of Classification Search
CPC ............. H01L 21/28556; H01L 21/321; H01L 21/3212; H01L 27/092; H01L 29/41783; H01L 29/495; H01L 29/66545
See application file for complete search history.

(56) References Cited

U.S. PATENT DOCUMENTS

| | | | | |
|---|---|---|---|---|
| 6,335,283 B1* | 1/2002 | Ngo | ................... | H01L 21/76826 257/E21.576 |
| 6,355,571 B1* | 3/2002 | Huang | ................... | B08B 7/0035 257/E21.226 |
| 7,604,708 B2* | 10/2009 | Wood | ..................... | C23C 14/022 118/715 |
| 7,723,228 B2* | 5/2010 | Rajagopalan | ..... | H01L 21/02074 257/E21.293 |
| 8,202,776 B2* | 6/2012 | Chang | ............... | H01L 21/28247 438/216 |

(Continued)

*Primary Examiner* — Anh D Mai
(74) *Attorney, Agent, or Firm* — Williams Morgan, P.C.

(57) ABSTRACT

Aspects of the present invention relate to approaches for forming a semiconductor device such as a field-effect-transistor (FET) having a metal gate with improved performance. A metal gate is formed on a substrate in the semiconductor device. Further processing can result in unwanted oxidation in the metal that forms the metal gate. A reducing agent can be used to de-oxidize the metal that forms the metal gate, leaving a substantially non-oxidized surface.

7 Claims, 11 Drawing Sheets

(56) References Cited

U.S. PATENT DOCUMENTS

| | | |
|---|---|---|
| 2003/0132482 A1 | 7/2003 | Miyazaki et al. |
| 2007/0152283 A1 | 7/2007 | Baik et al. |
| 2011/0062501 A1 | 3/2011 | Soss et al. |
| 2013/0113027 A1* | 5/2013 | Chiang ............. H01L 21/28518 257/288 |

* cited by examiner

METHOD FOR FORMING A METAL GATE INCLUDING DE-OXIDATION OF AN OXIDIZED SURFACE OF THE METAL GATE UTILIZING A REDUCING AGENT

BACKGROUND

Technical Field

This invention relates generally to the field of semiconductors and, more particularly, to approaches for improving gate performance of gates diminished by gate metal oxidation.

Related Art

During fabrication, semiconductor devices such as field-effect-transistors (FETs) often include one or more stages in which processing is performed in an open-air environment, or other environment in which portions of the FET may be exposed to oxygen. In applications in which metal gates (e.g., aluminum) are utilized, this oxygen exposure can lead to oxidation of portions of the gate that are so exposed. This oxidation can alter the characteristics of the gate metal, and, by extension, the gate itself, causing the gate to perform less optimally. In addition, the presence of an oxide layer can lead to unintended consequences in later fabrication steps, further degrading the performance of the gate.

SUMMARY

In general, aspects of the present invention relate to approaches for forming a semiconductor device such as a FET having a metal gate with improved performance. A metal gate is formed on a substrate in the semiconductor device. Further processing can result in unwanted oxidation in the metal that forms the metal gate. A reducing agent can be used to de-oxidize the metal that forms the metal gate, leaving a substantially non-oxidized surface.

A first aspect of the present invention provides a method for improving a performance of a metal gate in a semiconductor device, comprising: forming the metal gate on a substrate in the semiconductor device; and de-oxidizing, using a reducing agent, an oxidation layer formed on the metal gate.

A second aspect of the present invention provides a method for improving a performance of a metal gate in a semiconductor device having a gate stack formed on substrate, comprising: removing a dummy gate from the gate stack formed on a substrate; depositing a series of metal layers in a recess resulting from the removing of the dummy gate to form a replacement metal gate; planarizing the replacement metal gate using a chemical mechanical planarization (CMP) process; and applying a reducing agent to the planarized replacement metal gate to de-oxidize a layer of oxidation in the metal gate formed as a result of the CMP process.

A third aspect of the present invention provides a semiconductor device, comprising: a substrate; an NFET region and a PFET region formed on the substrate; a set of raised source-drain (RSD) regions formed on each of the NFET region and the PFET region; a replacement metal gate formed on each of the NFET region and the PFET region, the replacement metal gate having a de-oxidized layer formed by de-oxidizing a portion of the replacement metal gate using a de-oxidizing agent; and a contact to the de-oxidized layer of the replacement metal gate.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As used herein, "depositing" may include any now known or later developed techniques appropriate for the material to be deposited including but not limited to, for example: chemical vapor deposition (CVD), low-pressure CVD (LP-CVD), plasma-enhanced CVD (PECVD), sub-atmosphere CVD (SACVD) and high density plasma CVD (HDPCVD), room temperature CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

As indicated above, aspects of the present invention relate to approaches for forming a semiconductor device such as a FET having a metal gate with improved performance. A metal gate is formed on a substrate in the semiconductor device. Further processing can result in unwanted oxidation in the metal that forms the metal gate. A reducing agent can be used to de-oxidize the metal that forms the metal gate, leaving a substantially non-oxidized surface.

Figure 1:
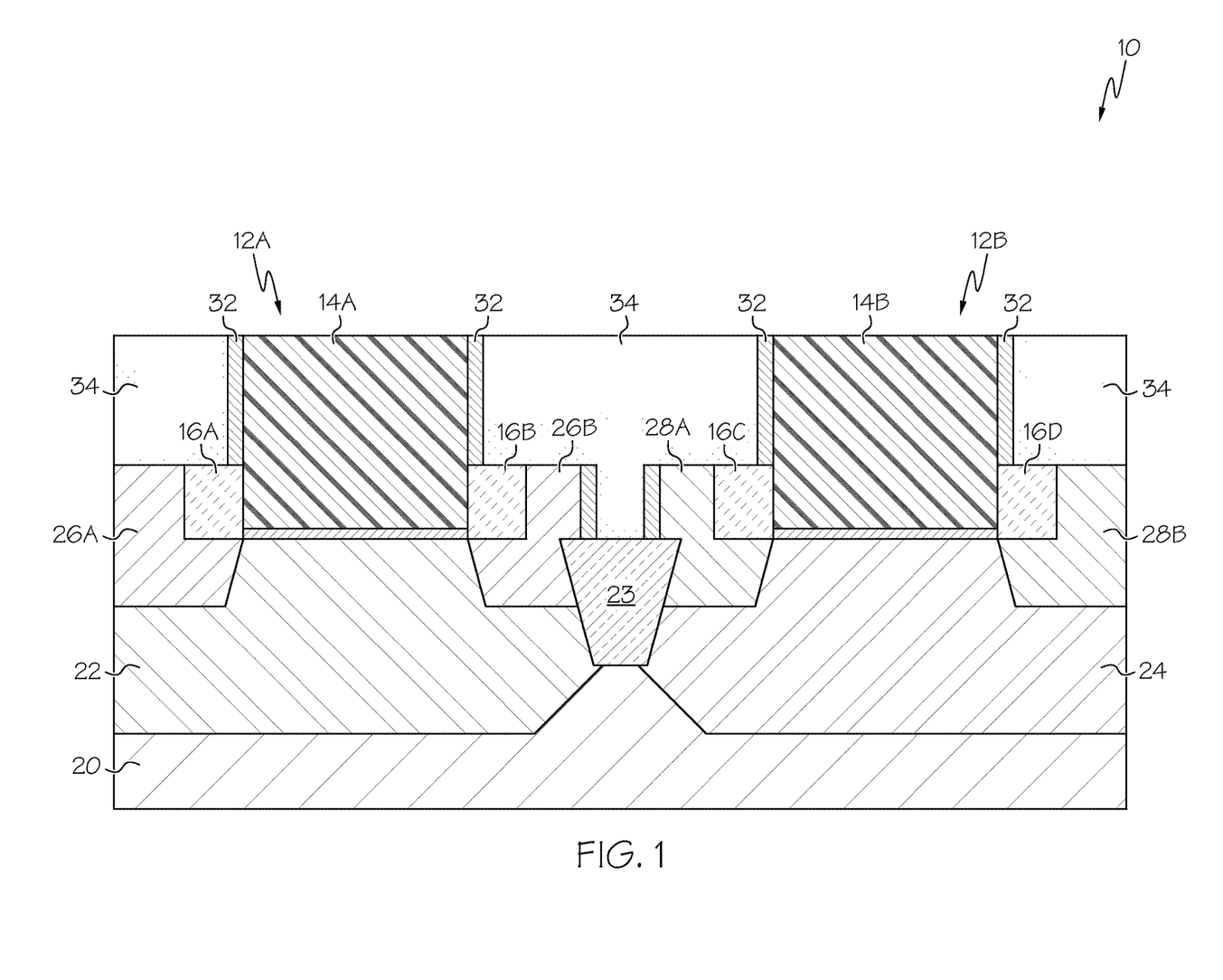
FIG. 1 shows a semiconductor device according to an embodiment of the present invention.

Referring now to FIG. 1, a cross-sectional view of a semiconductor device 10 according to an embodiment of the present invention is shown. As depicted, device 10 may include a set of gate stacks 12A-B formed over substrate 20. Gate stacks 12A-B may include dummy gates 14A-B (e.g., poly silicon, SiOC, SiOCN, and/or the like), spacers 16A-D and/or liners layer 32.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

As further shown, device 10 may include NFET region 22, PFET region 24, isolation region 23, raised source-drain (RSDs) 26A-B, 28A-B, which can include one or more phosphorus silicon (SiP) regions, one or more silicon germanium (SiGe) regions and/or the like. It is understood that the specifying of portions of RSD in accordance with use of certain materials (e.g., SiP and SiGe) should not be seen as limiting, but rather, use of any materials now known or later developed as being adapted for use in RSDs is envisioned. As further shown in FIG. 1, an inter-layer dielectric (ILD) 34 can also be deposited over semiconductor device 10 (e.g., over gate stacks 12a, 12b, RSDs 26A-B, 28A-B, etc.) and polished (e.g., via chemical-mechanical polishing (CMP)). It is understood that these layers/components are intended to be illustrative only and that other layers and/or materials may exist in device 10.

Figure 2:
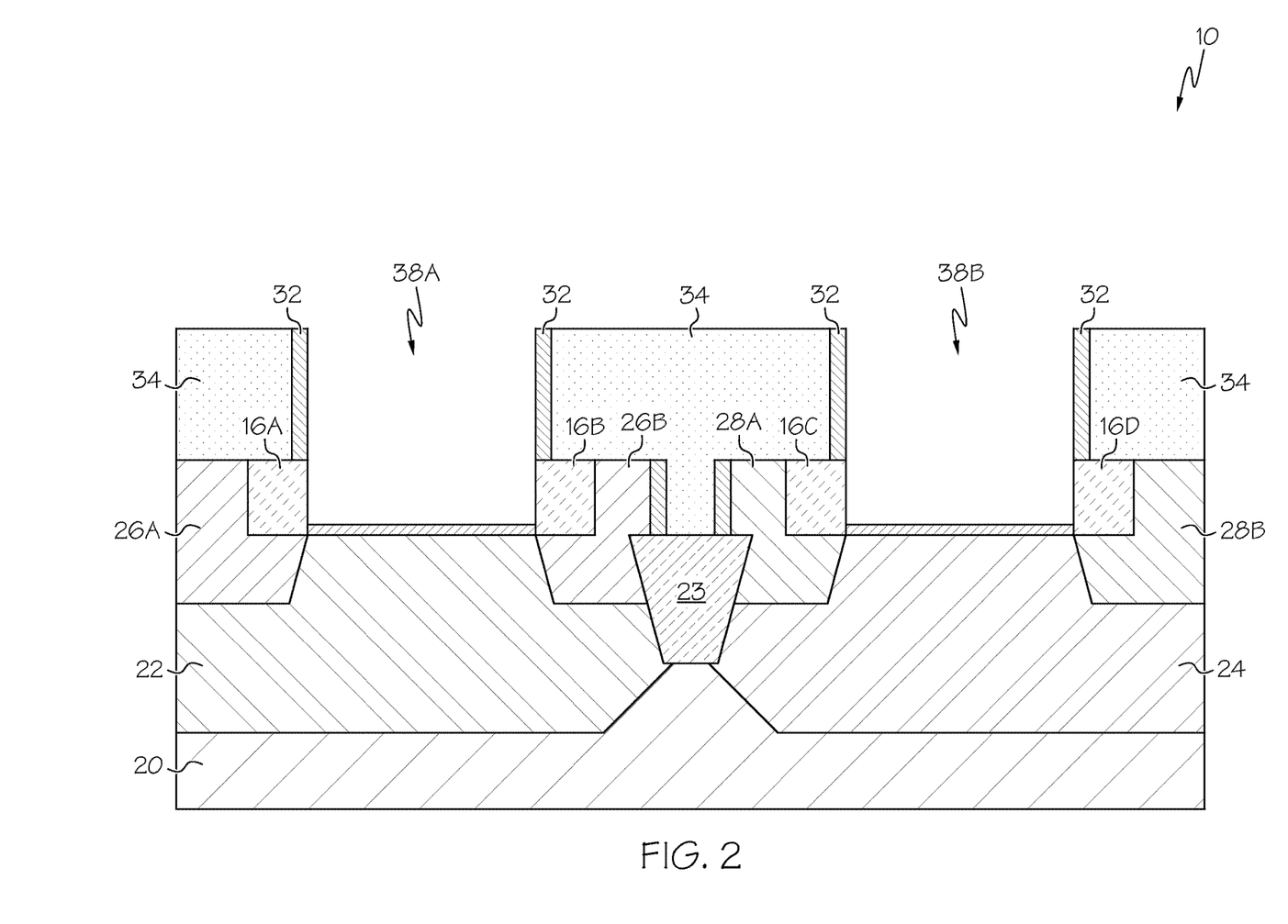
FIG. 2 shows removal of the dummy gates from the gate stacks of the device of FIG. 1 according to an embodiment of the present invention.

Referring now to FIG. 2, dummy gates (14A-B) can be removed from semiconductor device 10, leaving liner layer 32 and ILD 34 forming gate region/areas 38A-B (hereafter "recess"). The forming gate regions/areas 38A-B are bounded by liner layer 32.

Figure 3:
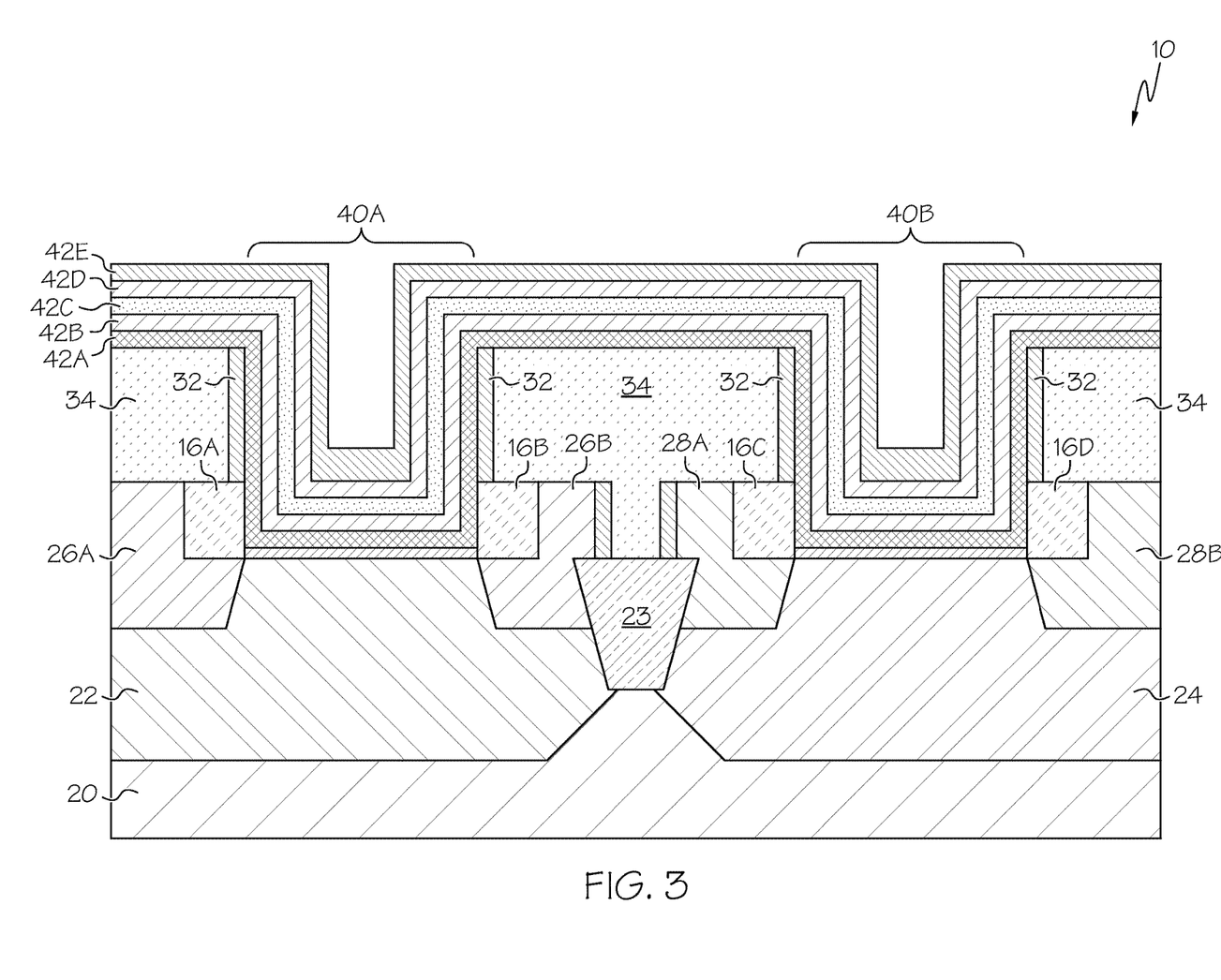
FIG. 3 shows a deposit of a gate to the device of FIG. 2 according to an embodiment of the present invention.

Then, as shown in FIG. 3, a set of gates (40A-B) can be formed in forming gate region/areas 38A-B. As shown, gates 40A-B can be replacement metal gates and can be formed by depositing a series of gate material layers 42A-E. Such a set of gate materials 42A-E can include an oxide stack 42A, including, but not limited to, Hafnium Oxide, covered by one or more work-function metal layers 42B-E, which can include, but not be limited to: Ti, TiN, Ta, TaN, TiAl, Al, TiC, W, and/or the like. Additionally, or in the alternative, any other solution now known or later discovered can be utilized (e.g., a metal gate of a single uniform substance). In any event, the portion of the gates 40A-B within forming gate region/areas 38A-B is bounded by liner layer 32.

Figure 4:
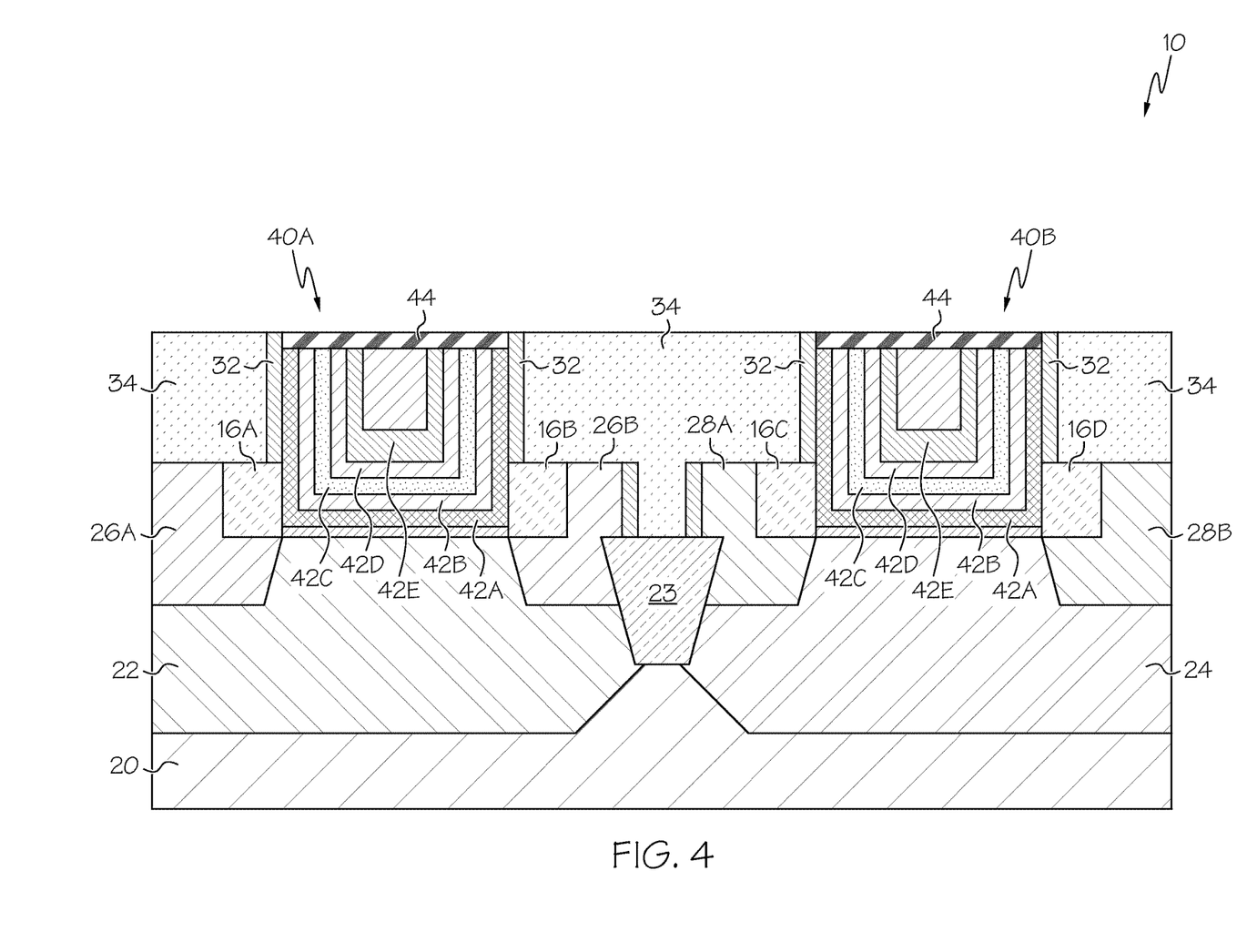
FIG. 4 shows removal of excess gate material from the device of FIG. 3 according to an embodiment of the present invention.

As shown in FIG. 4, any material that forms the gates 40A-B can then be removed, if necessary, from liner layer 32 and ILD 34 (e.g., by reactive ion etch (RIE), CMP, etc.). This removal can leave the metal forming gates 40A-B relatively level with or recessed with respect to an upper surface of ILD 34. However, because the removal process is often a wet process that is performed in an environment that contains oxygen (e.g., an open air environment and/or standard atmospheric environment), the metal forming gates 40A-B often undergo oxidation as a result. Any aluminum that may be used in the metal forming gates 40A-B which include aluminum can be particularly susceptible to this oxidation. As shown, an oxidation layer 44 has formed on the surface of gates 40A-B due to the oxidation of all of a portion of the metal forming gates 40A-B.

The inventors of the current invention have discovered that the formation of an oxidation layer, such as oxidation layer 44, may lead to performance issues in the semiconductor device 10. For example, oxides may be susceptible to degradation by certain substances that are often used when forming contacts to gates. For example, an issue known as tungsten encroachment can occur when a contact containing tungsten is formed on an aluminum gate in which an oxide layer has formed. The oxide layer can become degraded, causing the tungsten forming the gate to encroach into the oxide layer, forming an irregular surface. Such degradation can cause the contacts not to be formed correctly, potentially causing shorts, less-than-optimal interfaces between gate and contact, and/or the like. Oxides, such as aluminum oxide may have a greater electrical resistance that their non-oxide counterparts, causing performance issues in gates containing these oxide layers.

Figure 5A:
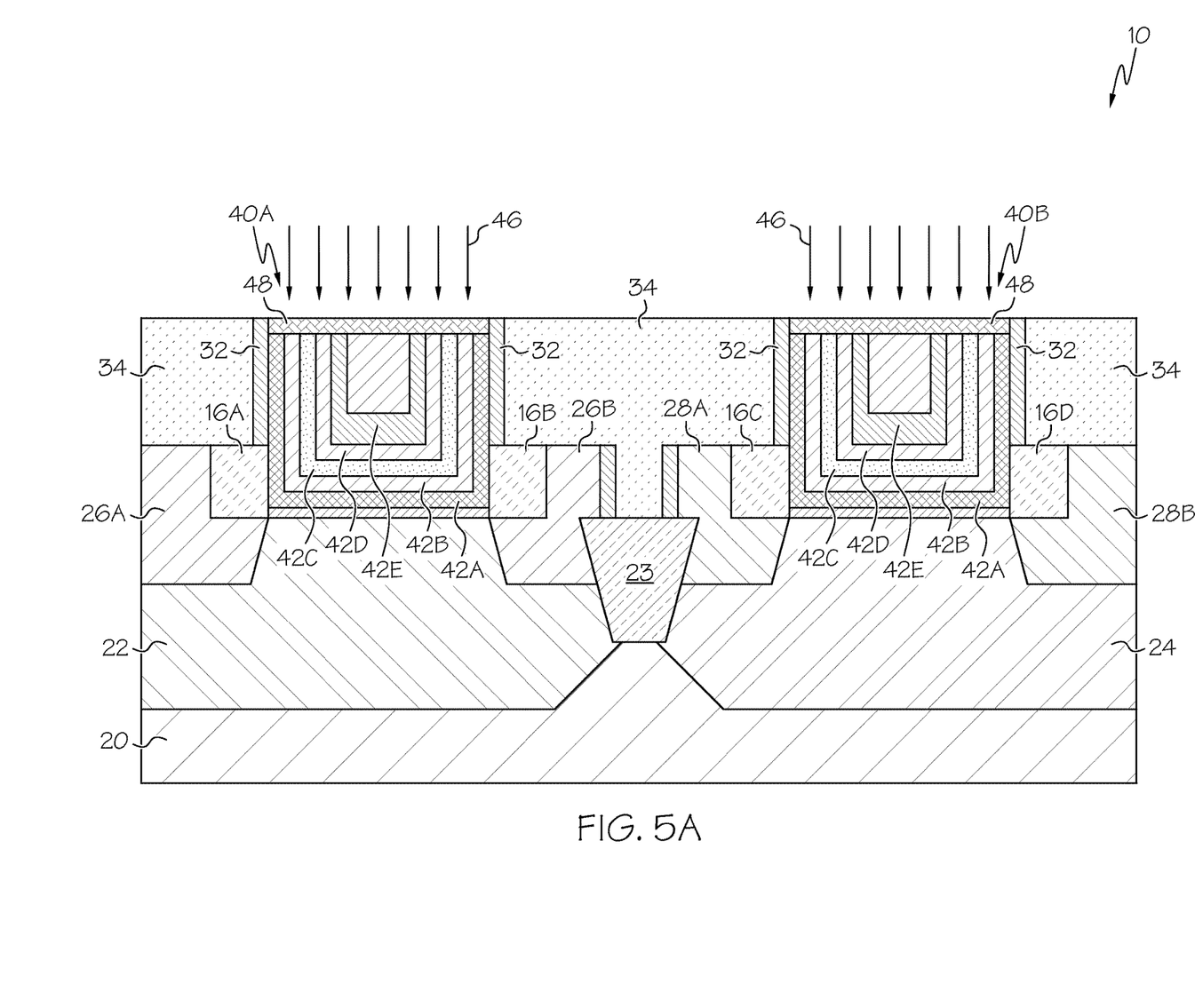
FIG. 5A shows an application of a reducing agent to the gate of the device of FIG. 4 according to an embodiment of the present invention.
Figure 5B:
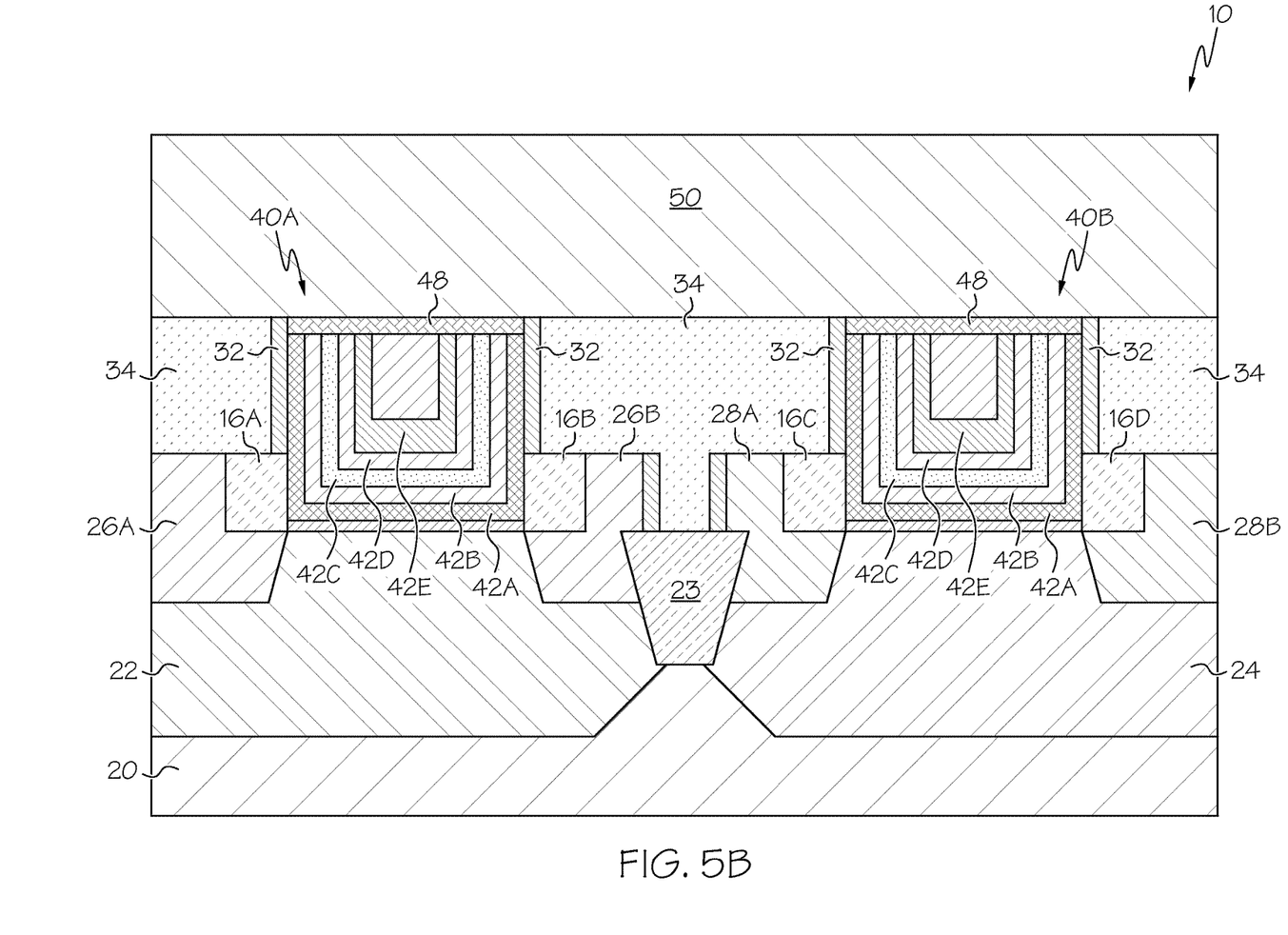
FIG. 5B shows a deposit of a hardmask layer to the device of FIG. 5A according to an embodiment of the present invention.
Figure 5C:
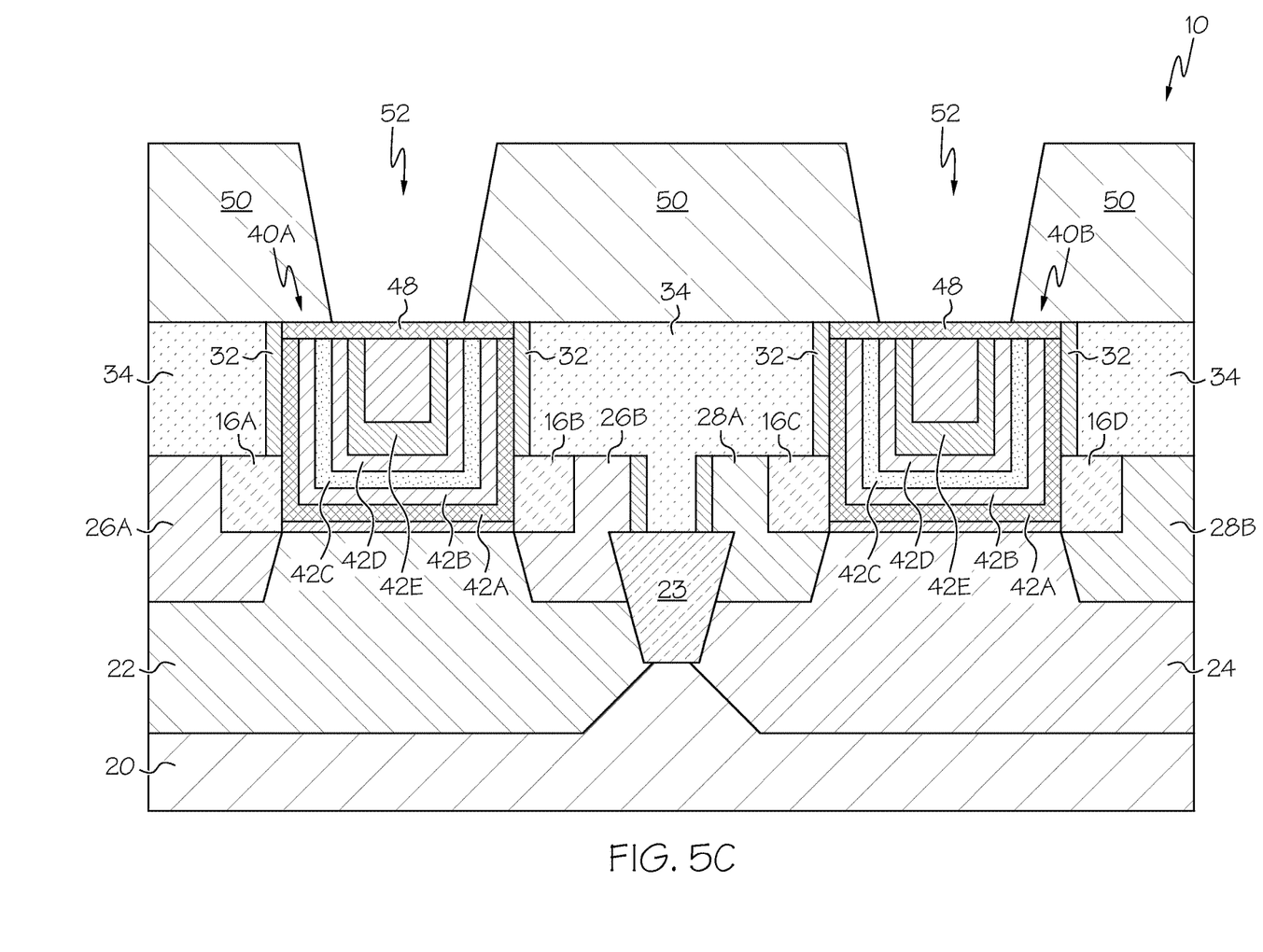
FIG. 5C shows a forming of a trench to the gate in the device of FIG. 5C according to an embodiment of the present invention.

Referring now to FIG. 5A-C, an embodiment for de-oxidizing the oxide layer 44 of gate 40A-B (FIG. 4) is shown. In FIG. 5A, a reducing agent 46 can be applied to gates 40A-B (e.g., in situ). In this embodiment, the reducing agent 46 is applied directly subsequent to the polishing, but before a hardmask 50 (FIG. 5B) is deposited. Reducing agent 46 can include one or more of a number of substances. For example, reducing agent 46 can include a $CH_4$ plasma. In this case, aluminum oxide in gate 40A-B can be de-oxidized according to the following: $Al_2O_3+3CH_4 \rightarrow 2Al+3CO+6H_2$. Additionally, or in the alternative, reducing agent 46 can include one or more of $H_2$ plasma, $NH_3$, and/or $N_2/H_2$ forming gas plasma. When one or more of these reducing agents are used, aluminum oxide in gate 40A-B can be de-oxidized according to the following: $Al_2O_3+3H_2 \rightarrow 2Al+3H_2O$. In any case, the application of reducing agent 46 to oxidation layer 44 (FIG. 4) of metal gate 40A-B causes oxidation layer 44 to transform into a de-oxidized layer 48 from which substantially all or a substantial portion of the oxidation has been removed.

Then, as shown in FIG. 5B, hardmask 50 (e.g., SiN) is deposited over gate 40A with de-oxidized layer 48 and ILD 34. In one embodiment, hardmask 50 can comprise either silicon nitride (SiN) or silicon dioxide (SiO2), or any other material(s) suitable as a hardmask, including silicon oxynitride (SiON), silicon oxycarbide (SiOC), and the like. Hardmask 104 can be prepared by PVD, CVD, spin coating, etc., depending on the material. It will be appreciated that hardmask 50 may include an alignment mark (not shown) due to its high optical contrast (e.g., 14%-35%).

Then, as shown in FIG. 5C, a trench 52 can be formed in hardmask 50. Trench 52 can be formed using a chemical photoresist strip or using any process now known or later developed.

Figure 6A:
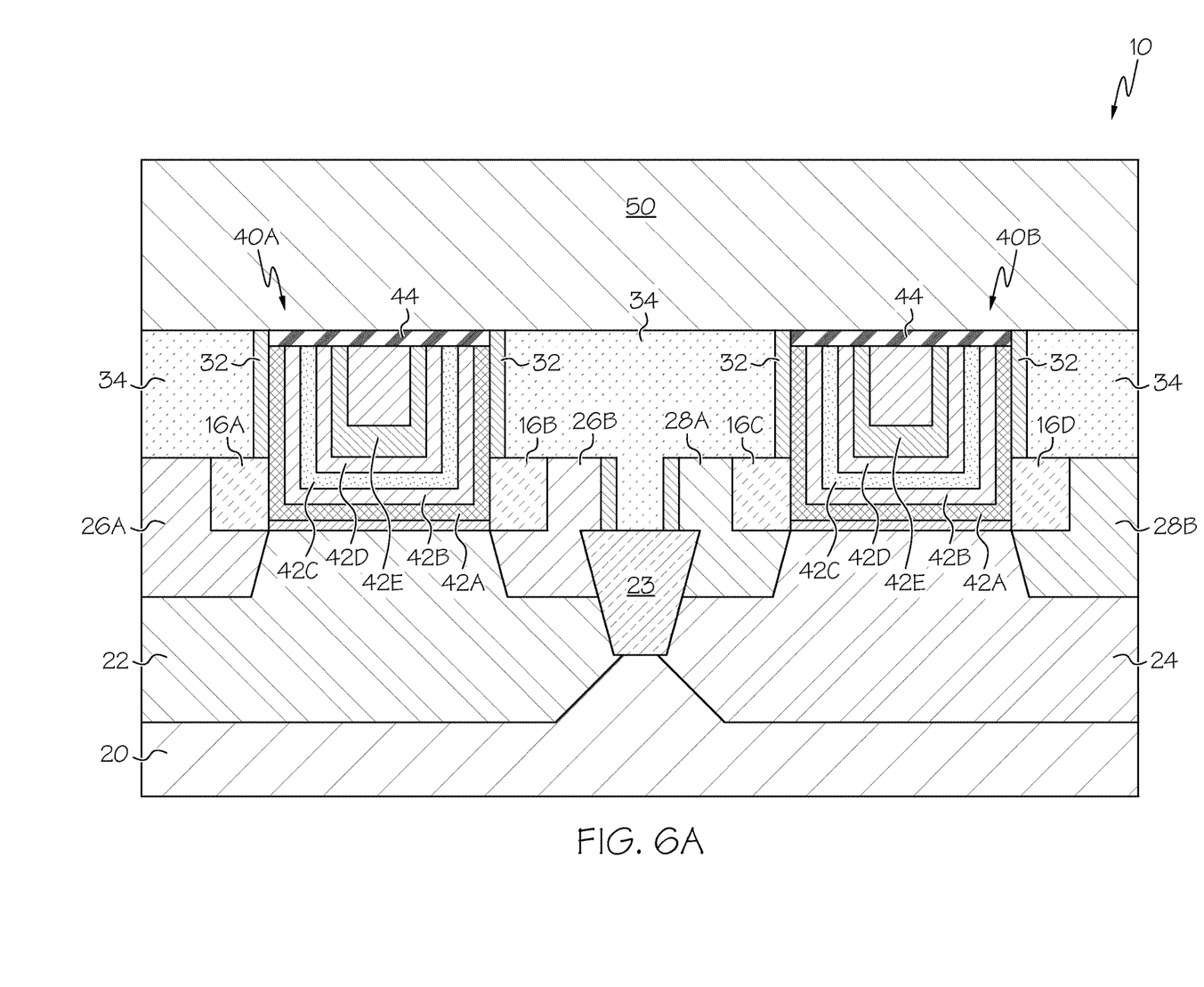
FIG. 6A shows a deposit of a hardmask layer to the device of FIG. 4 according to an embodiment of the present invention.
Figure 6B:
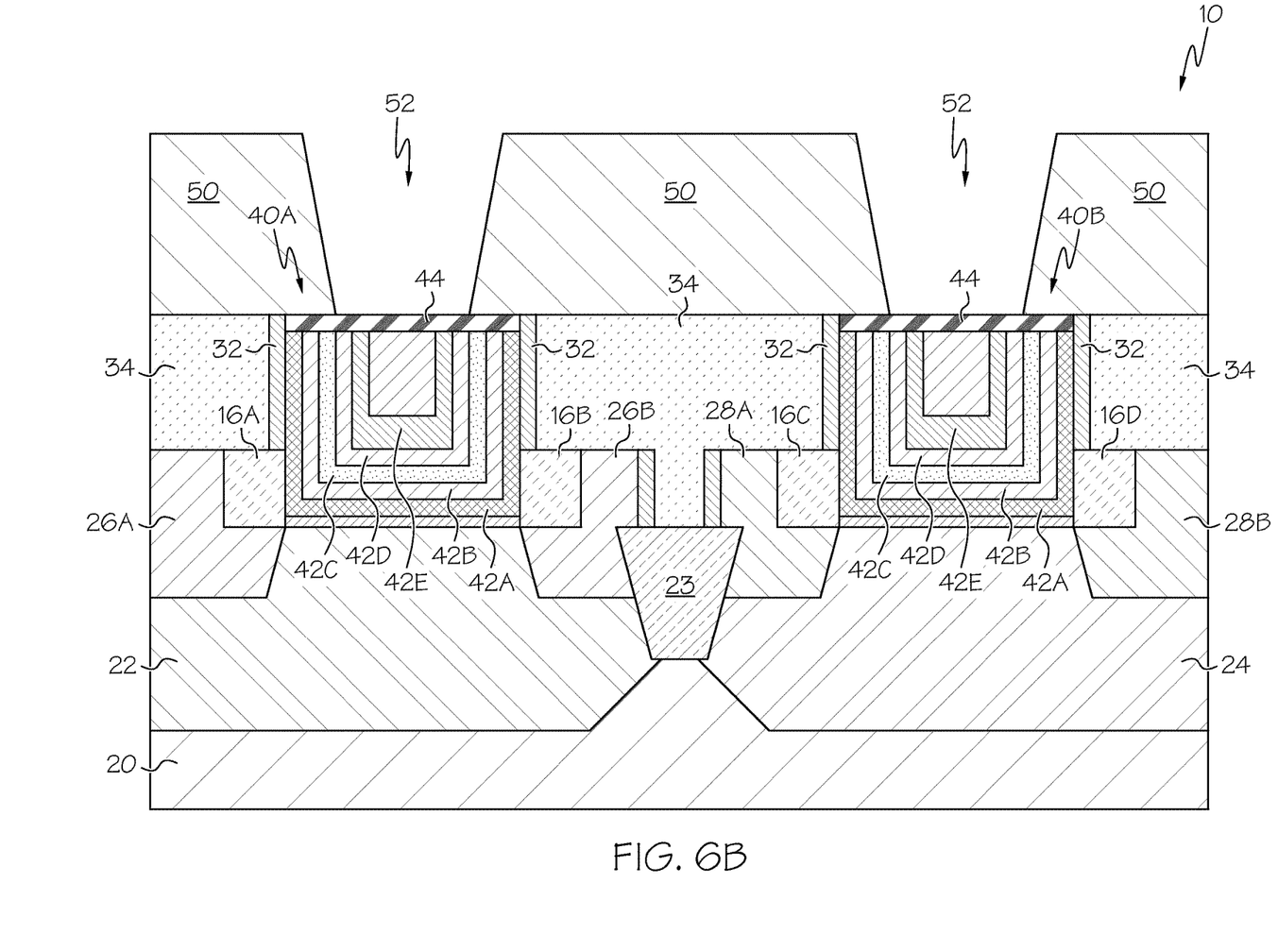
FIG. 6B shows a forming of a trench to the gate in the device of FIG. 6A according to an embodiment of the present invention.
Figure 6C:
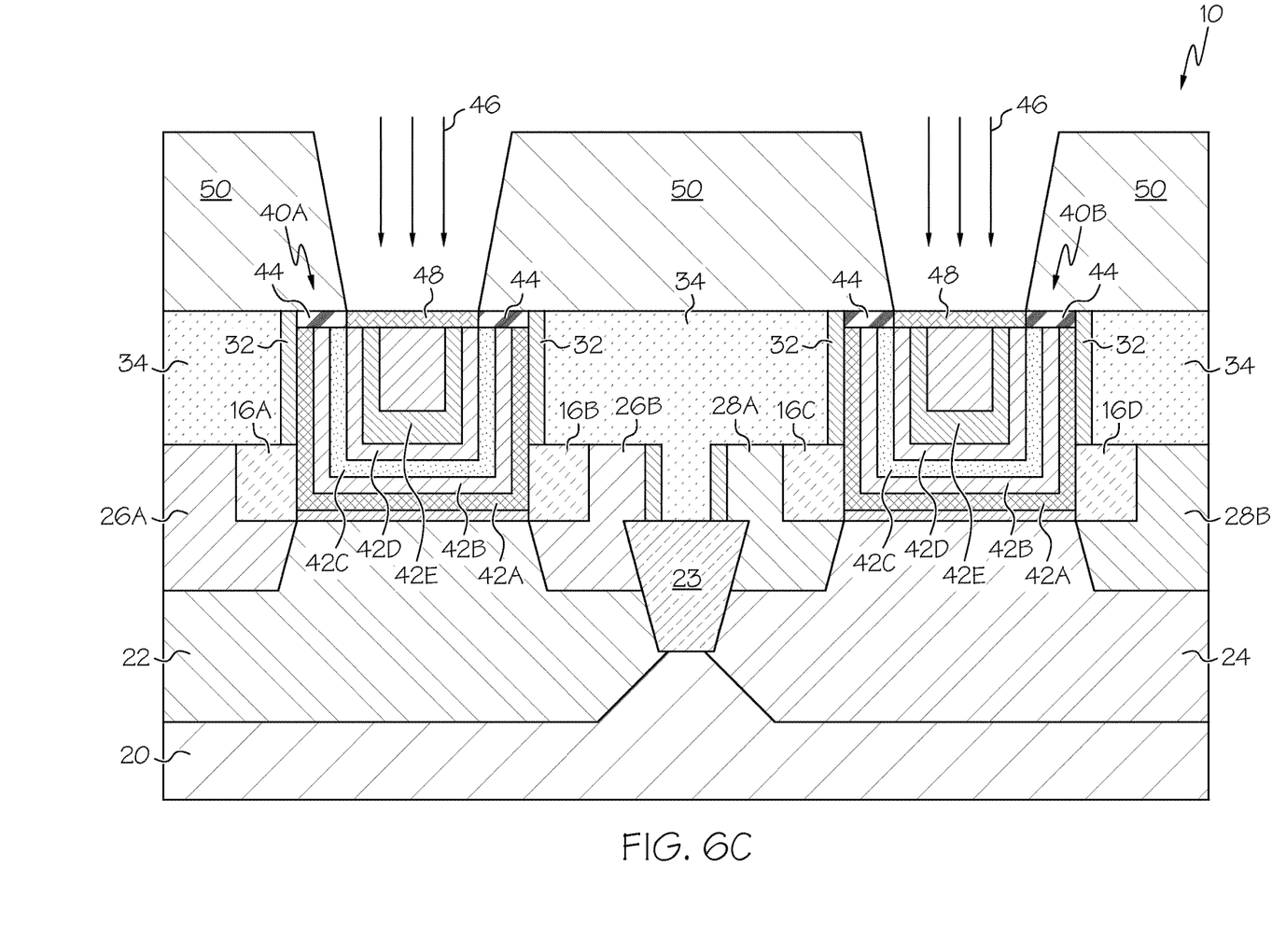
FIG. 6C shows an application of a reducing agent to the gate of the device of FIG. 6B according to an embodiment of the present invention.

Referring now to FIG. 6A-C, an embodiment for de-oxidizing the oxide layer 44 of gate 40A-B (FIG. 4) is shown. In FIG. 6A, a hardmask 50 (e.g., SiN) is deposited over gate 40A with de-oxidized layer 48 and ILD 34. Depositing of hardmask 50 can be performed in a manner that is similar to the forming of hardmask 50 described in conjunction with FIG. 5B. However, it should be noted that this embodiment hardmask 50 is deposited over the untreated oxidation layer 44.

Then, as shown in FIG. 6B, trench 52 can be formed in hardmask 50. Trench 52 can be formed using a chemical photoresist strip or using any process now known or later developed. Then, as shown in FIG. 6C, reducing agent 46 can be applied to gates 40A-B (e.g., in situ) to form de-oxidized layer 48. Application of reducing agent 46 can be performed using any of the reducing agents 46 and/or utilizing any processes described herein in conjunction with FIG. 5A. In contrast to the previously described embodiment, it should be recognized that in the current embodiment, reducing agent 46 is applied to oxidation layer 44 of gate 40A-B through trench 52.

Figure 7:
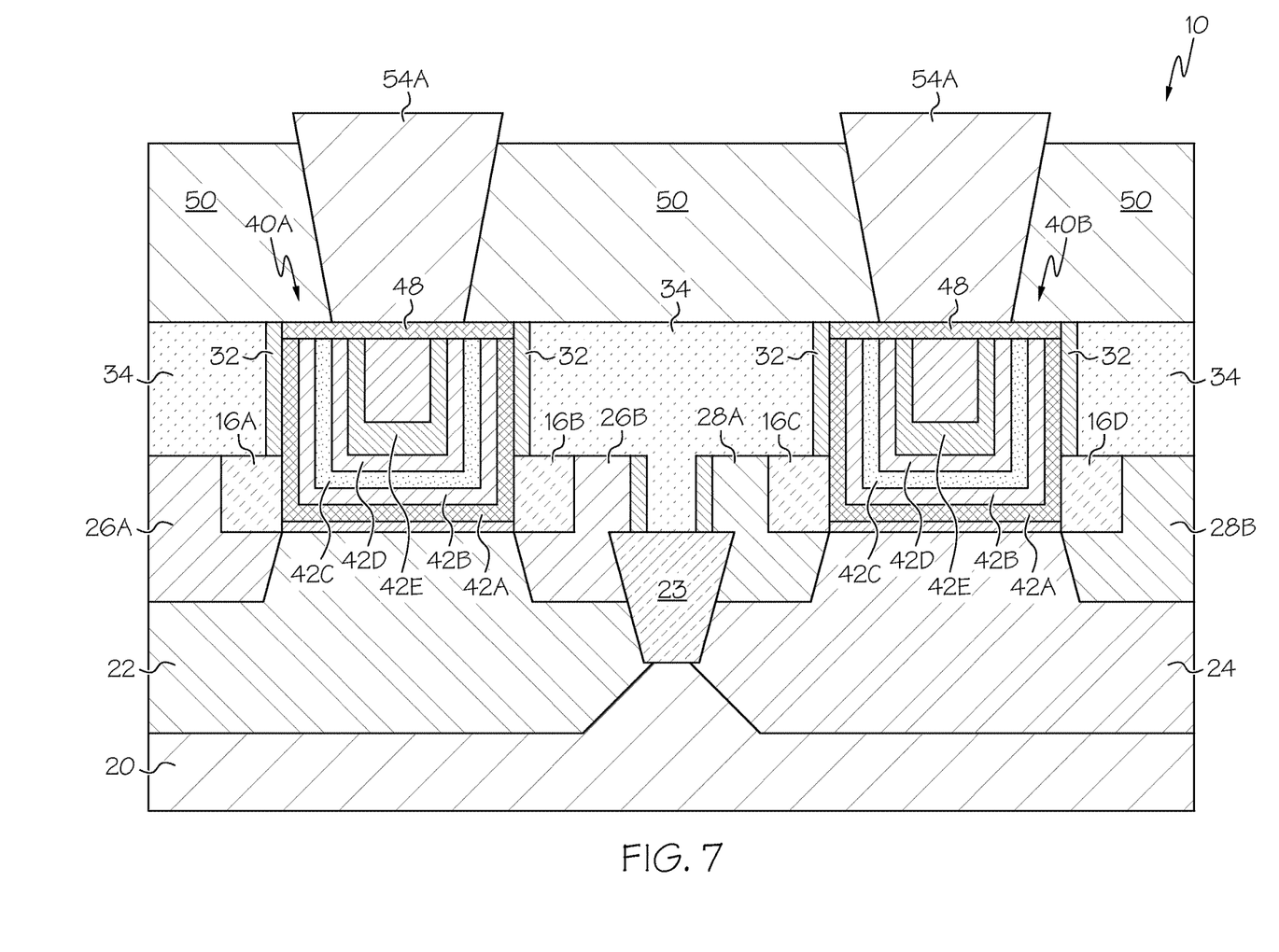
FIG. 7 shows a forming of a contact to the de-oxidation layer of the gate in the device of FIGS. 5C and 6C according to an embodiment of the present invention.

In the case of either embodiment, a set of contacts (54A-D) can be formed to contact gate 40A-B in trench 52, as shown in FIG. 7. This forming of contacts 54A-D can be preceded by a CD chemical etch selective to the gate. This CD etch is often performed using an ultra-dilute sulfur phosphate. Such a CD etch can sometimes etch away oxides, such as oxide layer 44 in the metal forming gate 40A-B. However, the application of reducing agent to oxide layer in the present invention results in a de-oxidized layer 48 that has greater resistance to the CD etch. The resulting contacts 54A-D (e.g., tungsten) can be formed to the gate with reduced chances of tungsten encroachment. Additionally, the forming of contact 54A-D to de-oxidized layer 48 of gate 40A-B can result in reduced gate electrical resistance, improving device performance.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention.

Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a metal gate in a semiconductor device, comprising:
   forming the metal gate on a substrate in the semiconductor device;

de-oxidizing, using a reducing agent, an oxidation layer formed on the metal gate; and forming raised source-drains in proximity to the metal gate.

2. The method of claim 1, wherein the reducing agent is selected from a group, consisting of: an H2 plasma, an H2/N2 plasma, a CH4 plasma, or an NH3 forming gas.

3. The method of claim 2, wherein the de-oxidizing is performed using an in-situ treatment with the reducing agent, and the method further comprises depositing a SiN hardmask over the metal gate after the de-oxidizing.

4. The method of claim 2, wherein the de-oxidizing is performed using an in-situ treatment with the reducing agent subsequent to a forming of a trench to the metal gate through a hardmask.

5. The method of claim 1, wherein the oxidation layer is formed by an oxidation of the metal gate resulting from an open-air environment.

6. The method of claim 1, further comprising:

forming a tungsten contact to the metal gate, wherein the de-oxidizing reduces a susceptibility of the metal gate to encroachment by the tungsten contact.

7. The method of claim 1, wherein the metal gate comprises aluminum, and wherein the oxidation layer comprises aluminum oxide formed by the interaction of the aluminum in the metal gate with oxygen.

\* \* \* \* \*